(12) United States Patent
Jung et al.

(10) Patent No.: US 11,777,058 B2
(45) Date of Patent: Oct. 3, 2023

(54) LIGHT-EMITTING DEVICE AND DISPLAY APPARATUS INCLUDING THE SAME

(71) Applicant: Samsung Display Co., Ltd., Yongin-si (KR)

(72) Inventors: Yunku Jung, Yongin-si (KR); Changhee Lee, Yongin-si (KR); Yunhyuk Ko, Yongin-si (KR); Dukki Kim, Yongin-si (KR); Jongwon Park, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 377 days.

(21) Appl. No.: 16/943,829

(22) Filed: Jul. 30, 2020

(65) Prior Publication Data

US 2021/0226093 A1 Jul. 22, 2021

(30) Foreign Application Priority Data

Jan. 10, 2020 (KR) .................. 10-2020-0003880

(51) Int. Cl.
*H01L 33/26* (2010.01)
*H01L 25/075* (2006.01)
*G09F 9/33* (2006.01)

(52) U.S. Cl.
CPC .......... *H01L 33/26* (2013.01); *H01L 25/0753* (2013.01); *G09F 9/33* (2013.01)

(58) Field of Classification Search
None
See application file for complete search history.

(56) References Cited

U.S. PATENT DOCUMENTS

| 10,246,634 | B2 | 4/2019 | Yang et al. | |
|---|---|---|---|---|
| 2014/0151600 | A1* | 6/2014 | Liu | C07D 407/14 252/301.36 |
| 2017/0158954 | A1* | 6/2017 | Yang | G03F 7/105 |
| 2017/0317228 | A1 | 11/2017 | Sung | |
| 2018/0138157 | A1* | 5/2018 | Im | H01L 33/382 |
| 2018/0148638 | A1* | 5/2018 | Ahn | C09K 11/025 |
| 2018/0182741 | A1* | 6/2018 | Sung | H01L 25/0753 |
| 2019/0218453 | A1 | 7/2019 | Qiu et al. | |
| 2019/0267510 | A1 | 8/2019 | Chen | |
| 2020/0343489 | A1* | 10/2020 | Park | H01L 51/56 |

FOREIGN PATENT DOCUMENTS

| KR | 10-1368179 B1 | 3/2014 |
| KR | 10-1672781 B1 | 11/2016 |
| KR | 10-2017-0048220 A | 5/2017 |
| KR | 10-1788297 B1 | 10/2017 |
| KR | 10-2019-0051989 A | 5/2019 |

OTHER PUBLICATIONS

Ulman, Abraham, "Formation and Structure of Self-Assembled Monolayers," American Chemical Society, Chemical Reviews, 1996, vol. 96, No. 4, pp. 1533-1554.

* cited by examiner

*Primary Examiner* — Khaja Ahmad
(74) *Attorney, Agent, or Firm* — Lewis Roca Rothgerber Christie LLP

(57) ABSTRACT

A light-emitting device (LED) includes a first semiconductor layer, a second semiconductor layer facing the first semiconductor layer, an insulating layer arranged to at least partially surround outer surfaces of the first semiconductor layer and the second semiconductor layer, and a first ligand bonded to a surface of the insulating layer and a second ligand bonded to the first ligand.

20 Claims, 7 Drawing Sheets

LIGHT-EMITTING DEVICE AND DISPLAY APPARATUS INCLUDING THE SAME

CROSS-REFERENCE TO RELATED APPLICATION

This application claims priority to and the benefit of Korean Patent Application No. 10-2020-0003880, filed on Jan. 10, 2020, in the Korean Intellectual Property Office, the entire content of which is incorporated herein by reference.

BACKGROUND

1. Field

One or more embodiments of the present disclosure relate to a light-emitting device and a display apparatus including the same.

2. Description of Related Art

Light-emitting devices (LEDs) have high light conversion efficiency and very low energy consumption and are semi-permanent and environmentally friendly. In order to utilize LEDs for lighting apparatuses or display apparatuses, the LEDs are coupled between a pair of electrodes capable of applying power to the LEDs. A method of coupling the LEDs to the electrodes may be classified, for example, into a method of directly growing the LEDs on a pair of electrodes and a method of separately growing the LEDs and aligning the LEDs on electrodes. In the latter case, it is difficult to align the LEDs on the electrodes when the LEDs are nano- or micro-scale.

SUMMARY

One or more embodiments include a display apparatus, in which a first ligand is bonded to a surface of an independently manufactured nano- or micro-scale light-emitting device (LED) and a second ligand is bonded to the first ligand, thereby improving the dispersibility of the LED in an ink composition and improving a ratio at which LEDs are aligned between a pair of electrodes. However, this feature is merely an example, and the scope of the disclosure is not limited thereby.

Additional aspects of embodiments will be set forth in part in the description which follows and, in part, will be apparent from the description, or may be learned by practice of the presented embodiments of the disclosure.

According to one or more embodiments, a light emitting device (LED) includes a first semiconductor layer, a second semiconductor layer facing the first semiconductor layer, an insulating layer arranged to at least partially surround outer surfaces of the first semiconductor layer and the second semiconductor layer, and a first ligand bonded to a surface of the insulating layer and a second ligand bonded to the first ligand.

The first ligand may be from a compound represented by Formula 1:

  Formula 1 wherein, in Formula 1, $A_1$ is selected from an alkylsiloxane group, an alkanephosphonic acid group, a catechol group, a carboxylic acid group, a thiol group, and an amine group, $A_2$ is selected from a halogen group, a vinyl group, an azide group, an oxirane group, an amine group, a hydroxyl group, an alcohol group, an ether group, an ester group, and a ketone group, and $R_1$ is selected from an alkyl group, a cyclohexyl group, a phenyl group, a methoxy group, an ether group, and an amide group, each of which have 1 to 12 carbon atoms.

The first ligand may be derived from a compound represented by one selected from Formulae 2-1 to 2-36:

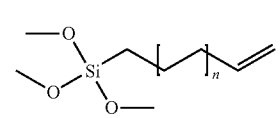 Formula 2-1

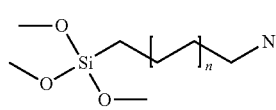 Formula 2-2

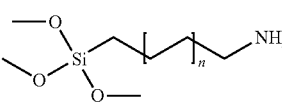 Formula 2-3

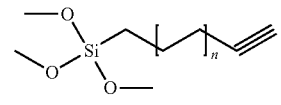 Formula 2-4

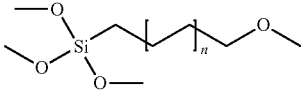 Formula 2-5

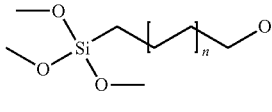 Formula 2-6

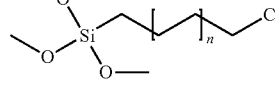 Formula 2-7

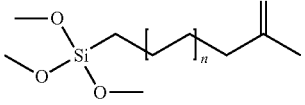 Formula 2-8

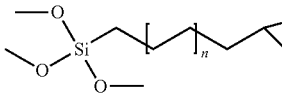 Formula 2-9

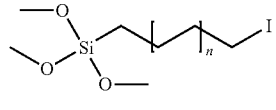 Formula 2-10

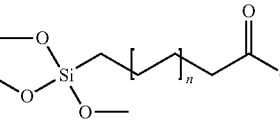 Formula 2-11

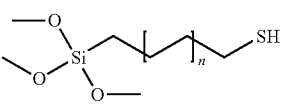 Formula 2-12

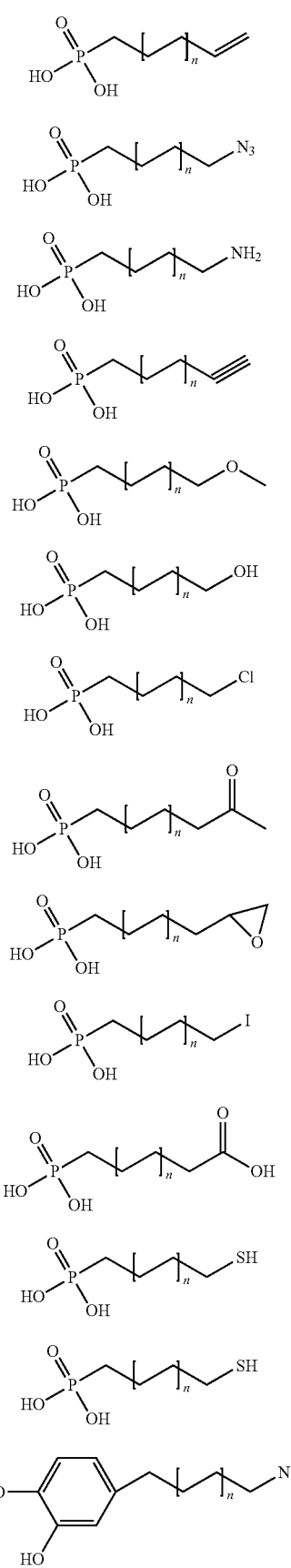
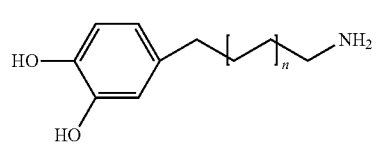
Formula 2-27
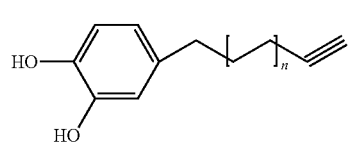
Formula 2-28
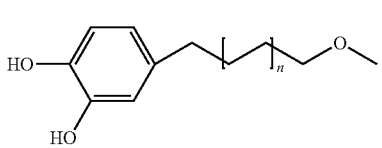
Formula 2-29
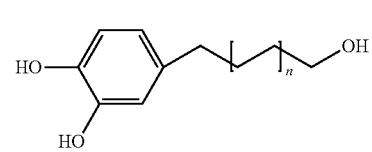
Formula 2-30
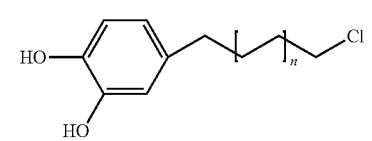
Formula 2-31
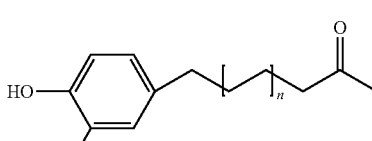
Formula 2-32
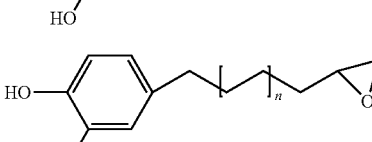
Formula 2-33
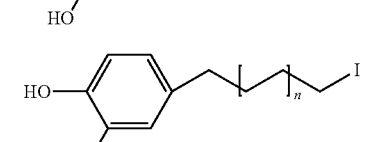
Formula 2-34
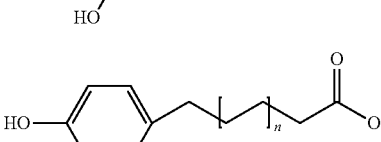
Formula 2-35
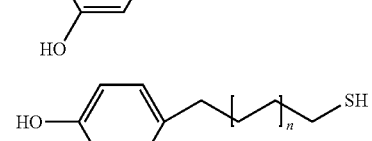
Formula 2-36
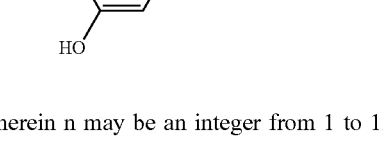
wherein n may be an integer from 1 to 12.
The first ligand may have a weight average molecular weight in a range of about 150 to about 500 daltons.
The second ligand may be derived from a compound represented by one selected from Formulae 3-1 to 3-3:

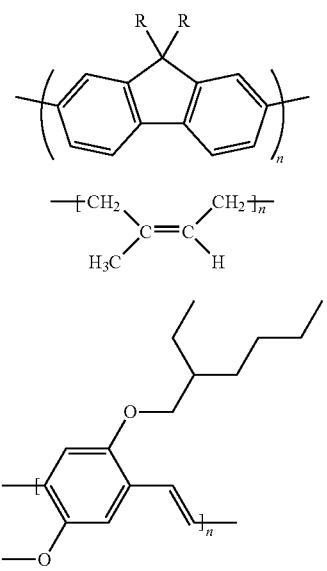

Formula 3-1

Formula 3-2

Formula 3-3 wherein $R_2$ may be selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group, $R_3$ may be selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group, and n may be an integer from 2 to 300.

The second ligand may include a polymer compound and may have a weight average molecular weight in a range of about 1,000 to about 90,000 daltons.

The first ligand and the second ligand may be bonded to each other by a condensation reaction or a polymerization reaction.

The first ligand and the second ligand may be different from each other.

The LED may further include an active layer arranged between the first semiconductor layer and the second semiconductor layer, and an electrode layer arranged on the second semiconductor layer.

The insulating layer may be arranged to at least partially surround (or completely surround) outer surfaces of the first semiconductor layer, the second semiconductor layer, the active layer, and the electrode layer.

One end of the first semiconductor layer and one end of the electrode layer may be exposed without being covered with the insulating layer.

The insulating layer may include at least one material selected from silicon oxide ($SiO_x$), silicon nitride ($SiN_x$), silicon oxynitride ($SiO_xN_y$), aluminum nitride (AlN), and aluminum oxide ($Al_2O_3$).

A diameter of the LED may be in a range of about 0.1 µm to about 0.9 µm.

A length of the LED may be in a range of about 0.5 µm to about 9 µm

An aspect ratio of the LED may be in a range of about 5 to about 10.

According to one or more embodiments, a display apparatus includes a substrate including a display area and a non-display area arranged around the display area, a first electrode and a second electrode spaced apart from each other in the display area, and an LED arranged between the first electrode and the second electrode, wherein the LED may include a first semiconductor layer, a second semiconductor layer, an active layer, an electrode layer, and an insulating layer, and wherein a first ligand is bonded to a surface of the LED, and a second ligand is bonded to the first ligand.

The first ligand may be bonded to the insulating layer of the LED.

The first ligand may have a weight average molecular weight in a range of about 150 to about 500 daltons.

The second ligand may include a polymer compound and may have a weight average molecular weight in a range of about 1,000 to about 90,000 daltons.

The display apparatus may further include a first contact electrode coupled to the first electrode, and a second contact electrode coupled to the second electrode, wherein the LED may be arranged between the first contact electrode and the second contact electrode.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
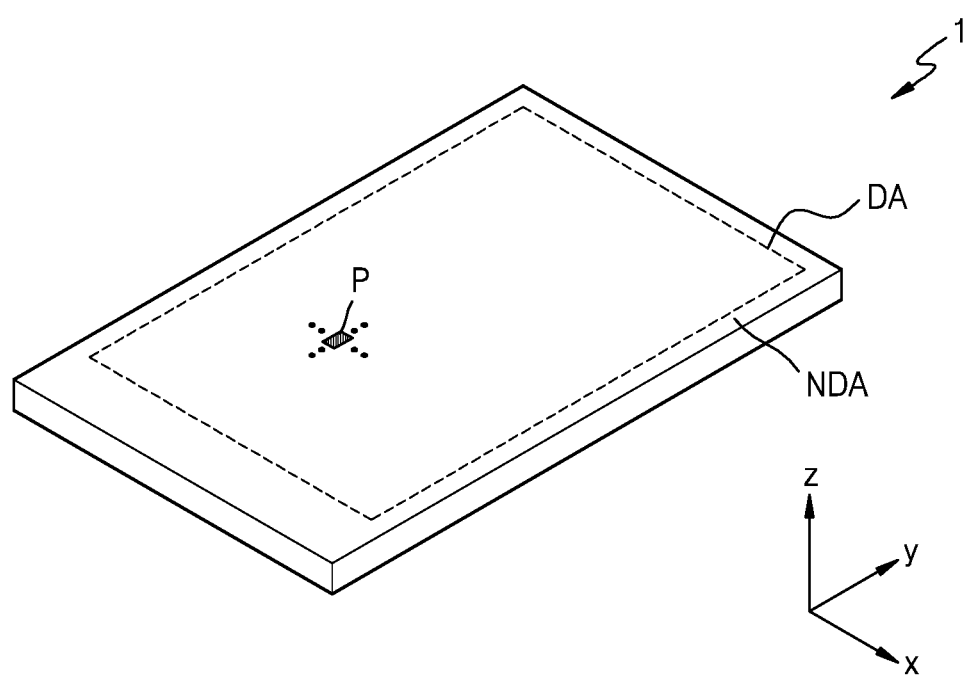
FIG. 1 is a schematic perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments will be described in more detail with reference to the accompanying drawings. When describing embodiments with reference to the accompanying drawings, the same or corresponding elements are denoted by the same reference numerals and a redundant description thereof will not be repeated.

It will be understood that although the terms "first," "second," etc. may be used herein to describe various elements, these elements should not be limited by these terms. These terms are only used to distinguish one element from another. As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements. It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of components in the drawings may be exaggerated for convenience of description. In other words, because the sizes and thicknesses of elements in the drawings may be arbitrarily illustrated for convenience of description, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a set or specific process order may be performed differently from the described order. For example, two consecutively described processes may be performed substantially at the same time or performed in an order opposite to the described order.

FIG. 1 is a schematic perspective view of a display apparatus 1 according to an embodiment.

Referring to FIG. 1, the display apparatus 1 may include a display area DA and a non-display area NDA arranged around the display area DA. For example, the non-display area NDA may surround the display area DA. The display apparatus 1 may provide an image by using light emitted from a plurality of pixels P arranged in the display area DA, and the non-display area NDA may be an area in which no image is displayed, or an area that is not designed to provide an image.

The display apparatus 1 including a flat display surface is illustrated in FIG. 1, but embodiments are not limited thereto. In an embodiment, the display apparatus 1 may include a three-dimensional display surface, a curved display surface, or a flexible display surface capable of being flat or curved.

When the display apparatus 1 includes a three-dimensional display surface, the display apparatus 1 may include a plurality of display areas indicating different directions. For example, the display apparatus 1 may include a polygonal columnar display surface. In an embodiment, when the display apparatus 1 includes a curved display surface, the display apparatus 1 may be implemented in various suitable forms, such as a flexible display apparatus, a foldable display apparatus, or a rollable display apparatus.

FIG. 1 illustrates the display apparatus 1 that is applicable to a mobile phone terminal. In some embodiments, electronic modules, camera modules, power supply modules, and/or the like, which are mounted on a main board, may be arranged in a bracket or a case together with the display apparatus 1 to constitute the mobile phone terminal. The display apparatus 1 according to the embodiment is applicable to large electronic apparatuses, such as televisions and monitors, and small and medium electronic apparatuses, such as tablets, car navigation systems, game consoles, and smart watches.

FIG. 1 illustrates a case in which the display area DA of the display apparatus 1 is rectangular, but the present disclosure is not limited thereto. For example, the shape of the display area DA may be a circle, an ellipse, or a polygon such as a triangle or a pentagon.

Figure 2:
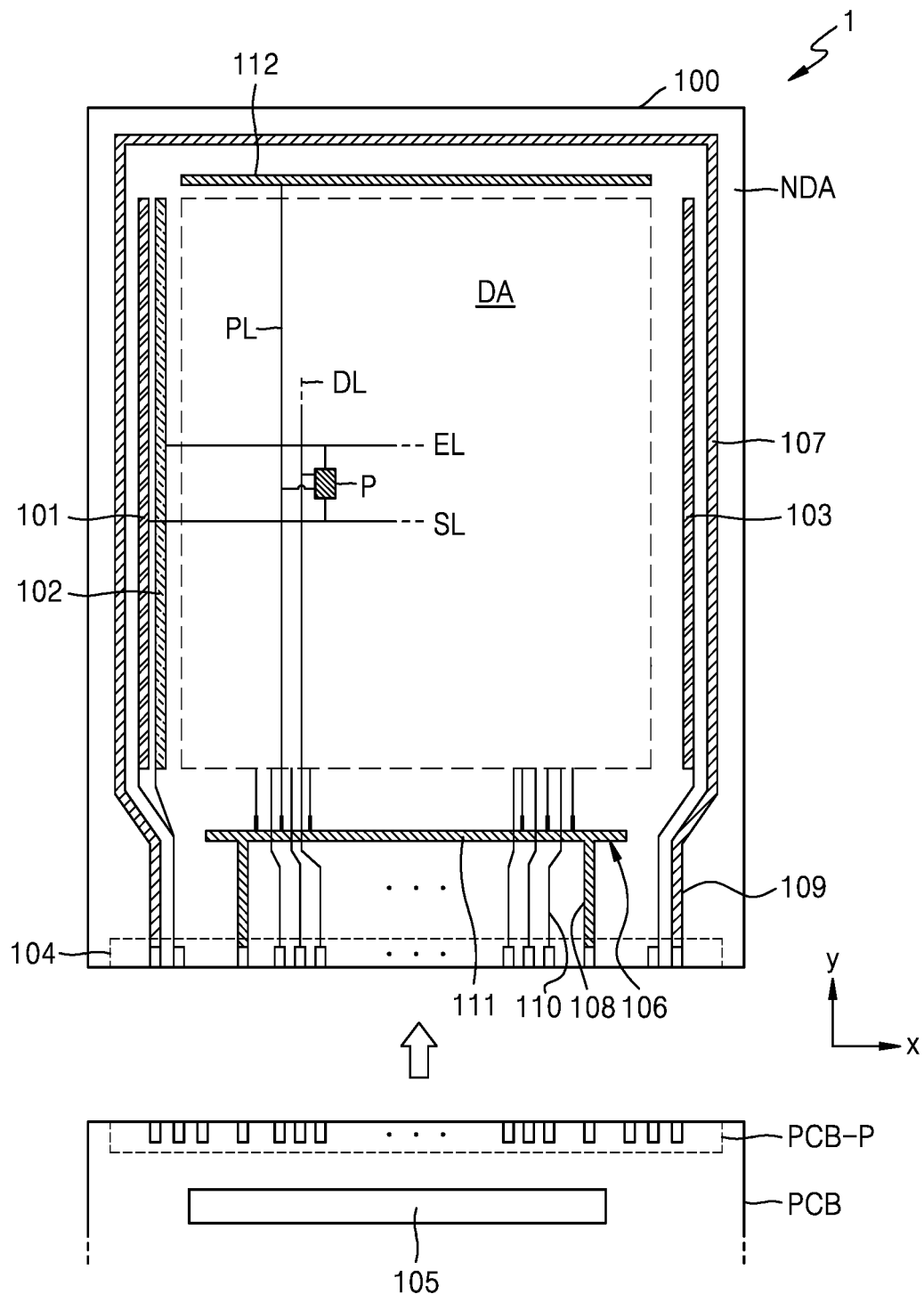
FIG. 2 is a schematic plan view of a display apparatus according to an embodiment.

FIG. 2 is a schematic plan view of a display apparatus 1 according to an embodiment.

Referring to FIG. 2, the display apparatus 1 may include a plurality of pixels P arranged in a display area DA. The pixels P may each include a display element such as a light-emitting device (LED) (175 of FIG. 5). The pixels P may each emit, for example, red light, green light, blue light, or white light from the LED (175 of FIG. 5). The term "pixel P" as used herein may be understood as a pixel that emits one selected from red light, green light, blue light, and white light as described above.

The pixels P may each be electrically coupled to external circuits arranged in the non-display area NDA. A first scan driving circuit 101, a first emission driving circuit 102, a second scan driving circuit 103, a terminal 104, a data driving circuit 105, a first power supply line 106, and a second power supply line 107 may be arranged in the non-display area NDA.

The first scan driving circuit 101 may provide a scan signal to the pixel P through a scan line SL. The first emission driving circuit 102 may provide an emission control signal to the pixel P through an emission control line EL. The second scan driving circuit 103 may be arranged in parallel with the first scan driving circuit 101 with the display area DA therebetween. Some pixels P arranged in the display area DA may be electrically coupled to the first scan driving circuit 101, and the others thereof may be electrically coupled to the second scan driving circuit 103. In an embodiment, a second emission driving circuit may be arranged in parallel with the first emission driving circuit 102 with the display area DA therebetween.

The first emission driving circuit 102 may be arranged on the non-display area NDA and may be spaced apart from the first scan driving circuit 101 in a first direction (x direction). In an embodiment, the first emission driving circuit 102 may be arranged alternately with the first scan driving circuit 101 in a second direction (y direction) crossing (e.g., intersecting) with the first direction (x direction).

The terminal 104 may be arranged on one side of a substrate 100. The terminal 104 may be exposed without being covered with an insulating layer and thus electrically coupled to a printed circuit board (PCB). A terminal PCB-P of the PCB may be electrically coupled to the terminal 104 of the display apparatus 1. The PCB may transmit a signal or power of a controller to the display apparatus 1. A control signal generated by the controller may be transmitted to the first scan driving circuit 101, the first emission driving circuit 102, and the second scan driving circuit 103 through the PCB. The controller may provide a first power supply voltage ELVDD and a second power supply voltage ELVSS to the first power supply line 106 and the second power supply line 107 through a first connection line 108 and a second connection line 109, respectively. The first power supply voltage ELVDD may be provided to the pixel P through a driving voltage line PL coupled to the first power supply line 106, and the second power supply voltage ELVSS may be provided to an opposite electrode of the pixel P coupled to the second power supply line 107.

The data driving circuit 105 may be electrically coupled to a data line DL. A data signal of the data driving circuit 105 may be provided to the pixel P through a connection line 110 coupled to the terminal 104 and the data line DL coupled to the connection line 110.

FIG. 2 illustrates that the data driving circuit 105 is arranged on the PCB, but in an embodiment, the data driving circuit 105 may be arranged on the substrate 100. For example, the data driving circuit 105 may be arranged between the terminal 104 and the first power supply line 106.

The first power supply line 106 may include a first sub-line 111 and a second sub-line 112 extending in parallel in the first direction (x direction) with the display area DA therebetween. The second power supply line 107 may at least partially surround the display area DA in a loop shape having one side open.

Figure 3:
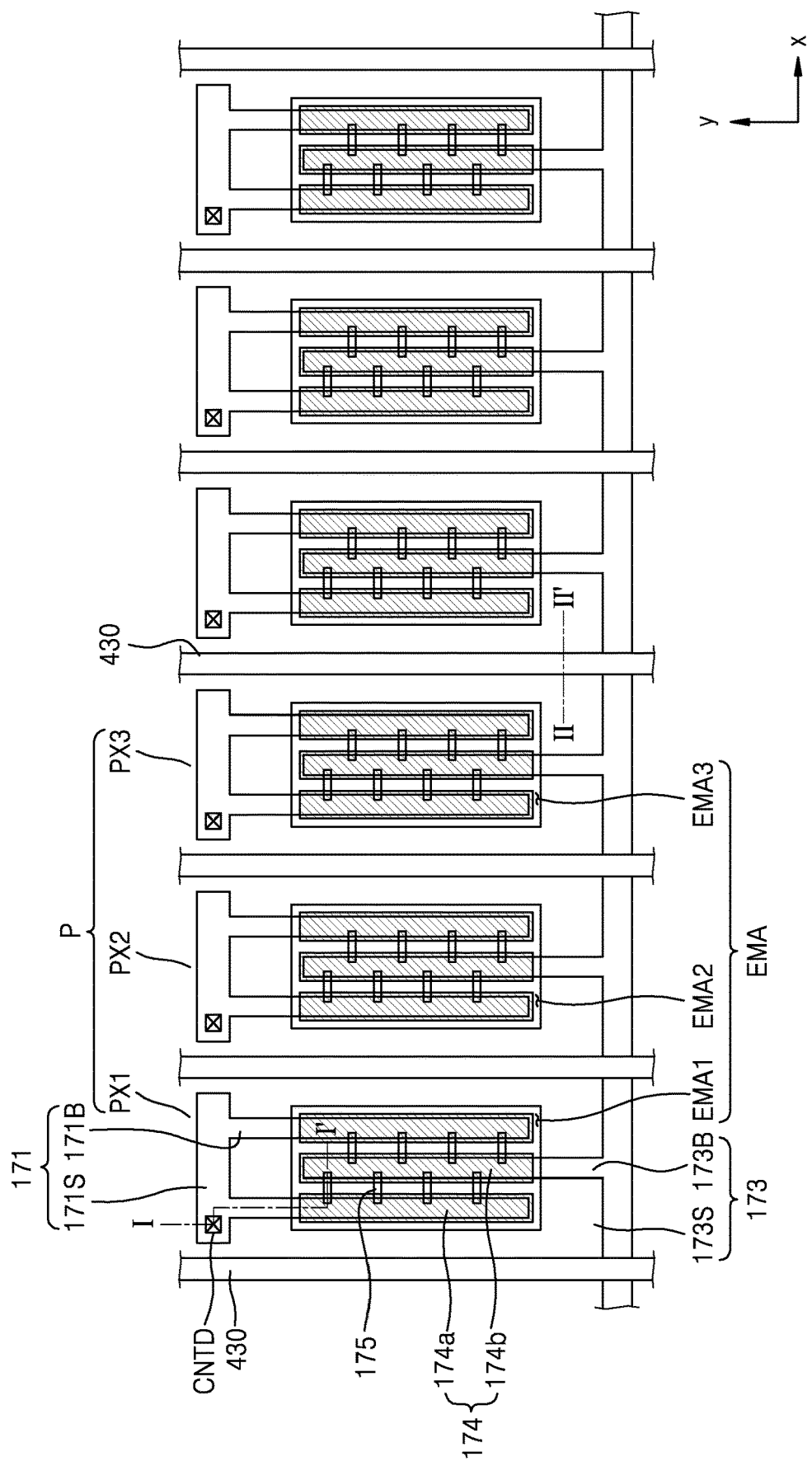
FIG. 3 is a plan view illustrating an example of pixels in a display area of FIG. 1.
Figure 4:
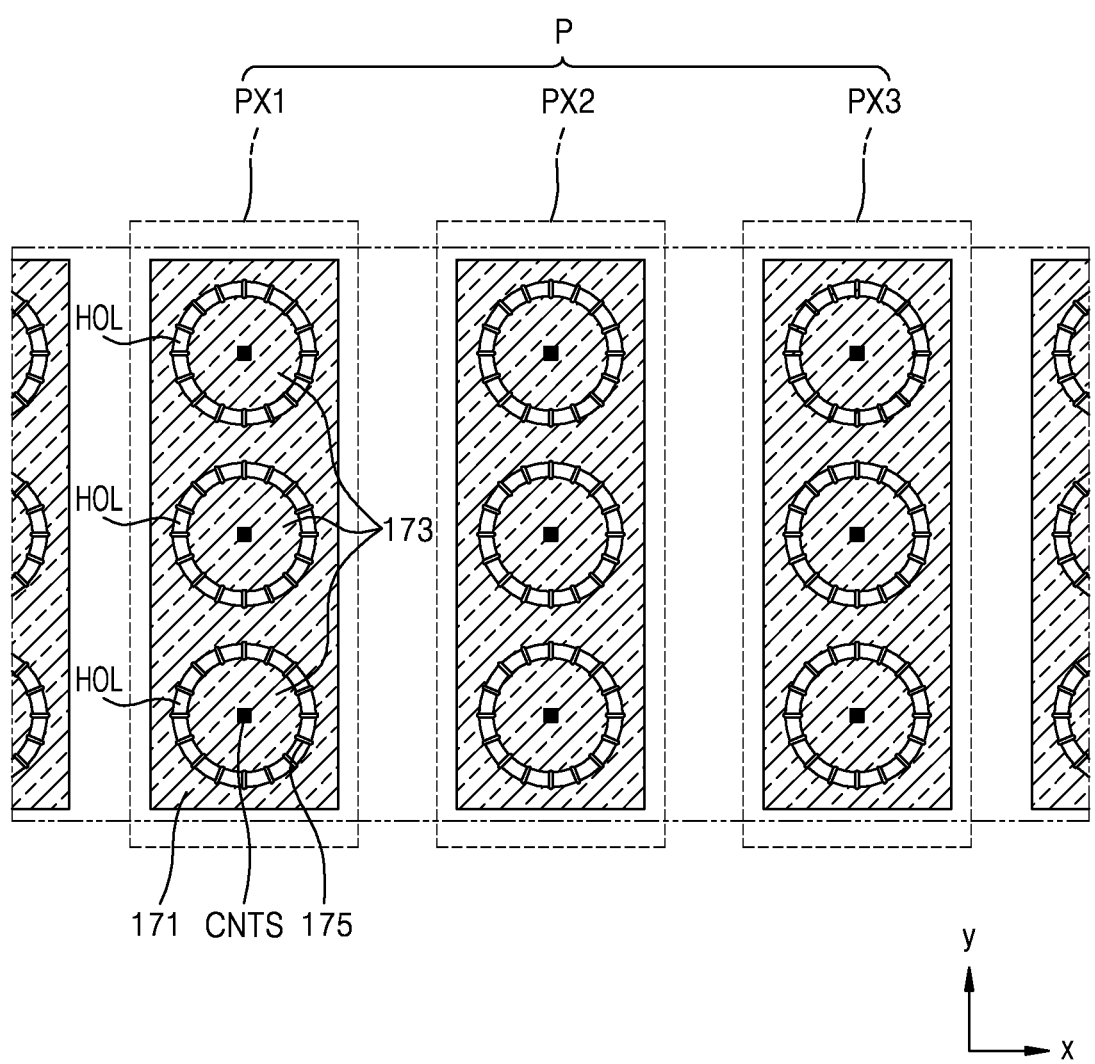
FIG. 4 is a plan view illustrating an example of pixels in a display area of FIG. 1.
Figure 5:
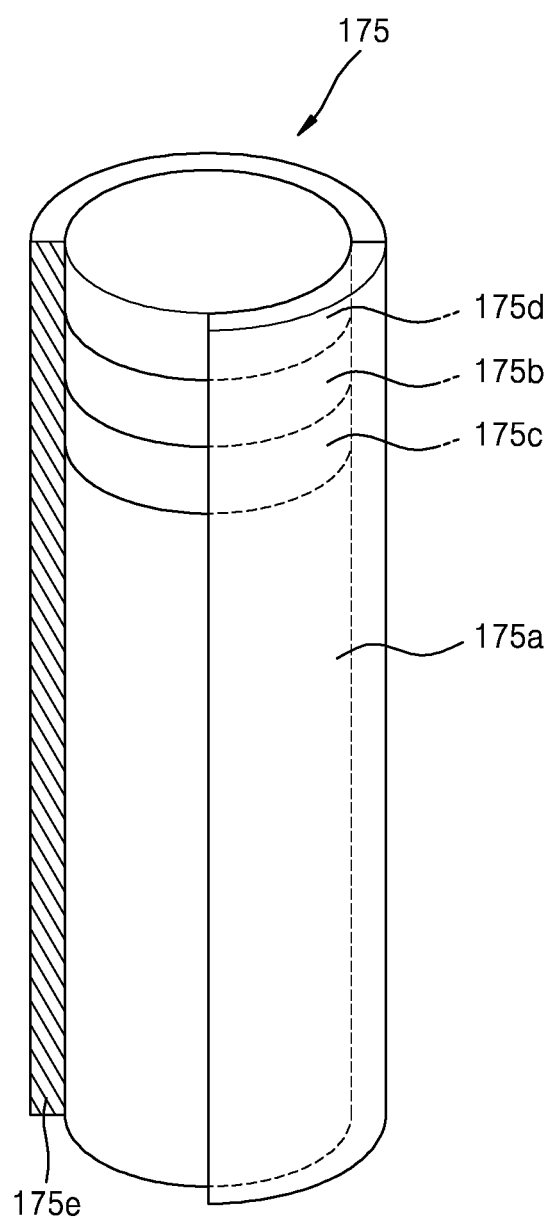
FIG. 5 is a schematic perspective view of a light-emitting device (LED) according to an embodiment.

FIG. 3 is a plan view illustrating an example of pixels P in the display area DA of FIG. 1, FIG. 4 is a plan view illustrating an example of pixels in the display area DA of FIG. 1, and FIG. 5 is a schematic perspective view of an LED according to an embodiment.

Referring to FIG. 3, the pixels P may each include a first sub-pixel PX1, a second sub-pixel PX2, and a third sub-pixel PX3. The first sub-pixel PX1 may emit a first light, the second sub-pixel PX2 may emit a second light, and the third sub-pixel PX3 may emit a third light. The first light may be red light, the second light may be green light, and the third light may be blue light, but embodiments are not limited thereto. For example, the first to third sub-pixels PX1, PX2, and PX3 may emit light of the same (e.g., substantially the same) color. In addition, FIG. 3 illustrates that the pixel P includes three sub-pixels, but embodiments are not limited thereto.

The first to third sub-pixels PX1, PX2, and PX3 may include an emission area EMA and a non-emission area. The first sub-pixel PX1 may include a first emission area EMA1, the second sub-pixel PX2 may include a second emission area EMA2, and the third sub-pixel PX3 may include a third emission area EMA3. The emission area EMA may be defined as an area in which the LED 175 is arranged to emit light of a set or specific wavelength. The non-emission area may be defined as an area other than the emission area EMA. The non-emission area may be an area in which the LED 175 is not arranged and light emitted from the LED 170 does not reach, and thus, light is not emitted.

The first to third sub-pixels PX1, PX2, and PX3 may each include a first electrode 171, a second electrode 173, a contact electrode 174, and the LED 175.

The first electrode 171 may be a pixel electrode separated for each of the first to third sub-pixels PX1, PX2, and PX3 (e.g., a pixel electrode divided to correspond to each of the first to third sub-pixels PX1, PX2, and PX3), and the second electrode 173 may be a common electrode commonly coupled to the first to third sub-pixels PX1, PX2, and PX3. In some embodiments, the first electrode 171 may be an anode electrode of the LED 175, and the second electrode 173 may be a cathode electrode of the LED 175.

The first electrode 171 and the second electrode 173 may include electrode stem portions 171S and 173S extending in the first direction (x direction), and one or more electrode branch portions 171B and 173B branched from the electrode stem portions 171S and 173S and extending in the second direction (y direction), respectively.

The first electrode 171 may include the first electrode stem portion 171S extending in the first direction (x direction) and at least one first electrode branch portion 171B branched from the first electrode stem portion 171S and extending in the second direction (y direction).

The first electrode stem portion 171S of one sub-pixel may be electrically separated from the first electrode stem portion 171S of another sub-pixel adjacent in the first direction (x direction). The first electrode stem portion 171S of one sub-pixel may be electrically separated from the first electrode stem portion 171S of another sub-pixel adjacent in the first direction (x direction). The first electrode stem portion 171S may be coupled to a thin-film transistor through a first electrode contact hole CNTD.

The first electrode branch portion 171B may be arranged to be spaced apart from the second electrode stem portion 173S in the second direction (y direction). The first electrode branch portion 171B may be arranged to be spaced apart from the second electrode branch portion 173B in the first direction (x direction).

The second electrode 173 may include the second electrode stem portion 173S extending in the first direction (x direction) and the second electrode branch portion 173B branched from the second electrode stem portion 173S and extending in the second direction (y direction).

The second electrode stem portion 173S of one sub-pixel may be electrically separated from the second electrode stem portion 173S of another sub-pixel adjacent in the first direction (x direction). The second electrode branch portion 173B may be arranged to cross the first to third sub-pixels PX1, PX2, and PX3 in the first direction (x direction).

The second electrode branch portion 173B may be arranged to be spaced apart from the first electrode stem portion 171S in the second direction (y direction). The second electrode branch portion 173B may be arranged to be spaced apart from the first electrode branch portion 171B in the first direction (x direction). The second electrode branch portion 173B may be arranged between the first electrode branch portions 171B in the first direction (x direction).

FIG. 3 illustrates that the first electrode branch portion 171B and the second electrode branch portion 173B extend in the second direction (y direction), but embodiments are not limited thereto. For example, the first electrode branch portion 171B and the second electrode branch portion 173B may each have a partially curved or bent shape, and one electrode may be arranged to surround the other electrode, as illustrated in FIG. 4. FIG. 4 illustrates a case in which the second electrode 173 has a circular shape, the first electrode 171 is arranged to surround the second electrode 173, an annular hole HOL is formed between the first electrode 171 and the second electrode 173, and the second electrode 173 receives a cathode voltage through a second electrode contact hole CNTS. For example, the first electrode branch portion 171B and the second electrode branch portion 173B may each be formed in any suitable shape as long as at least parts thereof are spaced apart to face each other, thereby forming a space that accommodates the LED 175 to be arranged.

The LED 175 may be arranged between the first electrode 171 and the second electrode 173. One end of the LED 175 may be electrically coupled to the first electrode 171, and the other end of the LED 175 may be electrically coupled to the second electrode 173. A plurality of LEDs 175 may be arranged to be spaced apart from each other. The LEDs 175 may be substantially aligned in parallel to each other.

The LED 175 may have a rod shape, a wire shape, a tube shape, and the like. For example, as illustrated in FIG. 5, the LED 175 may have a cylindrical shape or a rod shape. However, the shape of the LED 175 is not limited thereto, and the LED 175 may have a polygonal columnar shape such as a cubic shape, a rectangular parallelepiped shape, or a hexagonal columnar shape, or may extend in one direction to form a partially inclined outer surface. A length of the LED 175 may be in a range of about 0.5 μm to about 9 μm or about 1 μm to about 6 μm, for example, about 3 μm to about 5 μm. In addition, a diameter of the LED 175 may be in a range of about 0.1 μm to about 0.9 μm, and an aspect ratio of the LED 175 may be in a range of about 5 to about 10.

The LED 175 of the first sub-pixel PX1 may emit a first light, and the LED 175 of the second sub-pixel PX2 may emit a second light, and the LED 175 of the third sub-pixel PX3 may emit a third light. The first light may be red light having a center wavelength band in a range of about 620 nm to about 752 nm, the second light may be green light having a center wavelength band in a range of about 495 nm to about 570 nm, and the third light may be blue light having a center wavelength band in a range of about 450 nm to about 495 nm. In some embodiments, the LED 175 of the first sub-pixel PX1, the LED 175 of the second sub-pixel PX2, and the LED 175 of the third sub-pixel PX3 may emit light of substantially the same (e.g., substantially the same) color.

The contact electrode 174 may include a first contact electrode 174a and a second contact electrode 174b. The first contact electrode 174a and the second contact electrode 174b may each have a shape extending in the second direction (y direction).

The first contact electrode 174a may be arranged on the first electrode branch portion 171B and coupled to the first electrode branch portion 171B. The first contact electrode 174a may be in contact (e.g., physical contact) with one end of the LED 175. The first contact electrode 174a may be arranged between the first electrode branch portion 171B and the LED 175. Therefore, the LED 175 may be electrically coupled to the first electrode 171 through the first contact electrode 174a.

The second contact electrode 174b may be arranged on the second electrode branch portion 173B and coupled to the second electrode branch portion 173B. The second contact electrode 174b may be in contact (e.g., physical contact) with the other end of the LED 175. The second contact electrode 174b may be arranged between the second electrode branch portion 173B and the LED 175. Therefore, the LED 175 may be electrically coupled to the second electrode 173 through the second contact electrode 174b.

The width of the first contact electrode 174a (or the length of the first contact electrode 174a in the first direction (x direction)) may be greater than the width of the first electrode branch portion 171B (or the length of the first electrode branch portion 171B in the first direction (x direction)), and the width of the second contact electrode 174b (or the length of the second contact electrode 174b in the first direction (x direction)) may be greater than the width of the second electrode branch portion 173B (or the length of the second electrode branch portion 173B in the first direction (x direction)).

Outer banks 430 may be arranged between the first to third sub-pixels PX1, PX2, and PX3. The outer banks 430 may extend in the second direction (y direction). The length of each of the first to third sub-pixels PX1, PX2, and PX3 in the first direction (x direction) may be defined as a distance between the outer banks 430.

Referring to FIG. 5, the LED 175 may include a first semiconductor layer 175a, a second semiconductor layer 175b, an active layer 175c, an electrode layer 175d, and an insulating layer 175e.

The first semiconductor layer 175a may be, for example, an n-type semiconductor having a first conductivity type. The first semiconductor layer 175a may be one or more selected from n-type doped AlGaInN, GaN, AlGaN, InGaN, AlN, and InN. For example, when the LED 175 emits light of a blue wavelength band, the first semiconductor layer 175a may include a semiconductor material having a formula of $Al_xGa_yIn_{1-x-y}N$ ($0 \leq x \leq 1$, $0 \leq y \leq 1$, and $0 \leq x+y \leq 1$) The first semiconductor layer 175a may be doped with a first conductivity type dopant such as Si, Ge, and/or Sn. For example, the first semiconductor layer 175a may be n-GaN doped with n-type Si.

The second semiconductor layer 175b may be, for example, a p-type semiconductor having a second conductivity type and may be one or more selected from p-type doped AlGaInN, GaN, AlGaN, InGaN, AlN, and InN. For example, when the LED 175 emits light of a green wavelength band, the second semiconductor layer 175b may include a semiconductor material having a formula of $Al_xGa_yIn_{1-x-y}N$ ($0 \leq x \leq 1$, $0 \leq y \leq 1$, and $0 \leq x+y \leq 1$) The second semiconductor layer 175b may be doped with a second conductivity type dopant such as Mg, Zn, Ca, Se, or Ba. In an embodiment, the second semiconductor layer 175b may be p-GaN doped with p-type Mg.

The active layer 175c may be arranged between the first semiconductor layer 175a and the second semiconductor layer 175b. The active layer 175c may include a material having a single or multiple quantum well structure. When the active layer 175c includes a material having a multiple quantum well structure, where a plurality of quantum layers and a plurality of well layers may be alternately stacked. In some embodiments, the active layer 175c may have a structure in which a semiconductor material having large band gap energy and a semiconductor material having small band gap energy are alternately stacked, and may include different Group 3 to 5 semiconductor materials according to a wavelength band of emitted light.

The active layer 175c may emit light by recombination of electron-hole pairs according to electrical signals applied through the first semiconductor layer 175a and the second semiconductor layer 175b. Light emitted by the active layer 175c is not limited to light of a blue wavelength band, and the active layer 175c may emit light of a red or green wavelength band. For example, when the active layer 175c emits light of a blue wavelength band, the active layer 175c may include a material such as AlGaN and/or AlGaInN. In some embodiments, when the active layer 175c has a structure in which a quantum layer and a well layer are alternately stacked in a multiple quantum well structure, the quantum layer may include a material such as AlGaN and/or AlGaInN and the well layer may include a material such as GaN and/or AlInN. For example, when the active layer 175c includes AlGaInN as the quantum layer and AlInN as the well layer, the active layer 175c may emit blue light having a center wavelength band in a range of about 450 nm to about 495 nm.

Light from the active layer 175c may be emitted from both sides as well as the longitudinal outer surface of the LED 175. For example, the direction of the light emitted by the active layer 175c is not limited to one direction.

The electrode layer 175d may be an ohmic contact electrode or a Schottky contact electrode (e.g., an electrode formed by a junction of a semiconductor and a metal). The LED 175 may include at least one electrode layer 175d. When the LED 175 is electrically coupled to the first electrode 171 or the second electrode 173, the electrode layer 175d may reduce a resistance between the LED 175 and the first electrode 171 or the second electrode 173. The electrode layer 175d may include a conductive metal material such as at least one selected from aluminum (Al), titanium (Ti), indium (In), gold (Au), silver (Ag), indium tin oxide (ITO), indium zinc oxide (IZO), and indium tin-zinc oxide (ITZO). In addition, the electrode layer 175d may include an n-type or p-type doped semiconductor material.

The insulating layer 175e may be arranged to at least partially surround (or completely surround) the outer surfaces of the first semiconductor layer 175a, the second semiconductor layer 175b, the active layer 175c, and the electrode layer 175d. The insulating layer 175e serves to protect the first semiconductor layer 175a, the second semiconductor layer 175b, the active layer 175c, and the electrode layer 175d. The insulating layer 175e may be formed to expose both ends of the LED 175 in the longitudinal direction. For example, one end of the first semiconductor layer 175a and one end of the electrode layer 175d may be exposed without being covered with the insulating layer 175e. The insulating layer 175e may cover only the outer surfaces of part of the first semiconductor layer 175a and part of the second semiconductor layer 175b, including the active layer 175c, or may cover only the outer surface of part of the electrode layer 175d.

The insulating layer 175e may include materials having insulating properties such as, for example, silicon oxide ($SiO_x$), silicon nitride ($SiN_x$), silicon oxynitride ($SiO_xN_y$), aluminum nitride (AlN), aluminum oxide ($Al_2O_3$), and the like. An electrical short circuit that may occur when the active layer 175c is in direct contact (e.g., physical contact) with the first electrode 171 and the second electrode 173, through which electrical signals are transmitted to the LED 175, may be prevented or the likelihood or degree of such a short circuit may be reduced. In addition, because the insulating layer 175e protects the outer surface of the LED 175, including the active layer 175c, a reduction in luminescent efficiency may be prevented or reduced.

Figure 6:
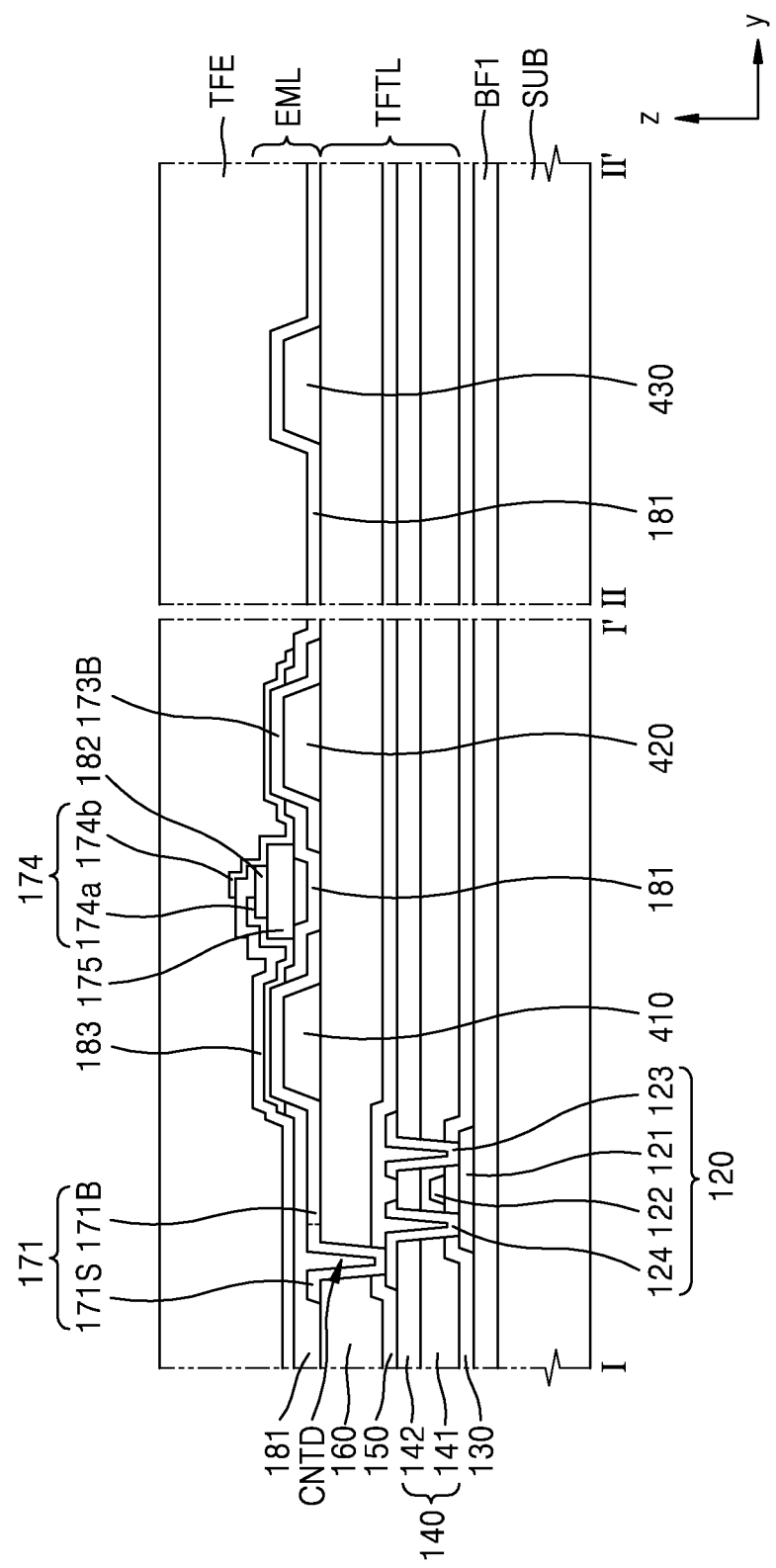
FIG. 6 is a schematic cross-sectional view of a display apparatus according to an embodiment.

FIG. 6 is a schematic cross-sectional view of the display apparatus according to an embodiment. For example, FIG. 6 corresponds to a cross-section taken along lines I-I' and II-II' of FIG. 3.

Referring to FIG. 6, a display layer including a first buffer layer BF1, a thin-film transistor layer TFTL, an LED layer EML, and an encapsulation layer TFE may be arranged on a substrate SUB.

The first buffer layer BF1 may be formed on one surface of the substrate SUB. The first buffer layer BF1 may be formed on one surface of the substrate SUB so as to protect thin-film transistors 120 and the LED layer EML of the display layer from moisture penetrating through the substrate SUB that is vulnerable to moisture permeation. The first buffer layer BF1 may include a plurality of inorganic layers that are alternately stacked. For example, the first buffer layer BF1 may be a multi-layer in which one or more inorganic layers selected from a silicon nitride layer, a silicon oxynitride layer, a silicon oxide layer, a titanium oxide layer, and an aluminum oxide layer are alternately stacked. The first buffer layer BF1 may be omitted.

The thin-film transistor layer TFTL may include thin-film transistors 120, a first insulating layer 130, an interlayer insulating layer 140, a protective layer 150, and a planarization layer 160.

The thin-film transistors 120 may be located on the first buffer layer BF1. The thin-film transistor 120 may include an active layer 121, a gate electrode 122, a source electrode 123, and a drain electrode 124. FIG. 6 illustrates a top gate structure in which the gate electrode 122 of the thin-film transistor 120 is located above the active layer 121, but the gate structure is not limited thereto. For example, the thin-film transistors 120 may be formed in a bottom gate structure in which the gate electrode 122 is located below the active layer 121 or a double gate structure in which the gate electrode 122 is located above and below the active layer 121.

The active layer 121 may be arranged on the first buffer layer BF1. The active layer 121 may include an oxide semiconductor and/or a silicon semiconductor. When the active layer 121 includes an oxide semiconductor, the active layer 121 may include, for example, an oxide of at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the active layer 121 may be InSnZnO (ITZO), InGaZnO (IGZO), and/or the like. When the active layer 121 includes a silicon semiconductor, the active layer 121 may include, for example, amorphous silicon (a-Si) and/or low temperature polysilicon (LTPS) obtained by crystallizing amorphous silicon (a-Si).

A light blocking layer may be arranged on the first buffer layer BF1. The light blocking layer may be arranged to correspond to the thin-film transistor. The light blocking layer may prevent the gate electrode, the source electrode, and the drain electrode of the thin-film transistor from being visually recognized from the outside, or may reduce the visibility thereof from the outside. A voltage may be applied to the light blocking layer. For example, the light blocking layer may be coupled to the source electrode or the drain electrode of the thin-film transistor. Because the light blocking layer is supplied with a voltage in connection with potential of the source electrode or the drain electrode of the thin-film transistor, the thin-film transistor of the display apparatus may be stabilized. In an embodiment, the light blocking layer may be coupled to a separate line without being coupled to the source electrode or the drain electrode of the thin-film transistor.

The first insulating layer 130 may be arranged on the active layer 121. The first insulating layer 130 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 130 may be a single layer or a multi-layer including the above-described inorganic insulating material.

A gate electrode 122 and a gate line may be arranged on the first insulating layer 130. The gate electrode 122 may overlap the active layer 121 and may be arranged on the first insulating layer 130. The gate electrode 122 and the gate line may each be a single layer or a multi-layer including at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first interlayer insulating layer 141 may be arranged on the gate electrode 122. The first interlayer insulating layer 141 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first interlayer insulating layer 141 may be a single layer or a multi-layer including the above-described inorganic insulating material.

A storage capacitor may be arranged on the first insulating layer 130. The storage capacitor may include a lower electrode and an upper electrode. The storage capacitor may overlap the thin-film transistor 120. The lower electrode of the storage capacitor may be arranged as one body with the gate electrode 122 of the thin-film transistor 120. In an embodiment, the storage capacitor may not overlap the thin-film transistor 120, and the lower electrode may be an independent element separate from the gate electrode 122 of the thin-film transistor 120.

A second interlayer insulating layer 142 may be arranged on the first interlayer insulating layer 141. The second interlayer insulating layer 142 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second interlayer insulating layer 142 may be a single layer or a multi-layer including the above-described inorganic insulating material.

The source electrode 123 and the drain electrode 124 may be arranged on the second interlayer insulating layer 142. The source electrode 123 and the drain electrode 124 may each be coupled to the active layer 121 through a contact hole passing through the interlayer insulating layer 140. The source electrode 123 and the drain electrode 124 may each include a conductive material including molybdenum (Mo), aluminum (Al), copper (Cu), titanium (Ti), and the like and may each be a single layer or a multi-layer including the above-described material. For example, the source electrode 123 and the drain electrode 124 may each have a multi-layered structure of Ti/Al/Ti.

A protective layer 150 may be arranged on the source electrode 123 and the drain electrode 124 so as to insulate the thin-film transistor 120. The protective layer 150 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The protective layer 150 may be a single layer or a multi-layer including the above-described inorganic insulating material.

The planarization layer 160 may be arranged on the protective layer 150. The planarization layer 160 may have a flat upper surface such that the electrode arranged thereon is formed flat. The planarization layer 160 may include an organic layer such as an acrylic resin, an epoxy resin, a phenolic resin, a polyamide resin, and/or a polyimide resin.

An LED layer EML may be arranged on the thin-film transistor layer TFTL. The LED layer EML may include a first inner bank 410, a second inner bank 420, a first electrode 171, a second electrode 173, a contact electrode 174, an LED 175, a second insulating layer 181, a third insulating layer 182, and a fourth insulating layer 183.

The first inner bank 410, the second inner bank 420, and the outer bank 430 may be arranged on the planarization layer 160. The first inner bank 410, the second inner bank 420, and the outer bank 430 may protrude from the upper surface of the planarization layer 160. The first inner bank 410, the second inner bank 420, and the outer bank 430 may have a trapezoidal cross-sectional shape, but embodiments are not limited thereto. Lower surfaces of the first inner bank 410, the second inner bank 420, and the outer bank 430 may come in contact (e.g., physical contact) with the upper surface of the planarization layer 160, upper surfaces of the first inner bank 410, the second inner bank 420, and the outer bank 430 may face the lower surfaces of the first inner bank 410, the second inner bank 420, and the outer bank 430, and side surfaces of the first inner bank 410, the second inner bank 420, and the outer bank 430 may be between the upper surfaces and the lower surfaces of the first inner bank 410, the second inner bank 420, and the outer bank 430. The side surfaces of the first inner bank 410, the side surfaces of the second inner bank 420, and the side surfaces of the outer bank 430 may be inclined.

The first inner bank 410 and the second inner bank 420 may be spaced apart from each other. The first inner bank 410 and the second inner bank 420 may each include an organic layer such as an acrylic resin, an epoxy resin, a phenolic resin, a polyamide resin, and/or a polyimide resin.

A first electrode branch portion 171B may be arranged on the first inner bank 410, and a second electrode branch portion 173B may be arranged on the second inner bank 420. The first electrode branch portion 171B may be coupled to the first electrode stem portion 171S, and the first electrode stem portion 171S may be coupled to the drain electrode 124 of the thin-film transistor 120 through the first electrode contact hole CNTD. Therefore, the first electrode 171 may receive a voltage from the drain electrode 124 of the thin-film transistor 120.

The first electrode 171 and the second electrode 173 may each include a conductive material having high reflectance. For example, the first electrode 171 and the second electrode 173 may each include a metal such as silver (Ag), copper (Cu), and/or aluminum (Al). Therefore, light, which is emitted from the LED 175 and travels to the first electrode 171 and the second electrode 173, may be reflected by the first electrode 171 and the second electrode 173 and travel above the LED 175.

A second insulating layer 181 may be arranged on the first electrode 171 and the second electrode branch portion 173B. The second insulating layer 181 may be arranged to cover the first electrode stem portion 171S, the first electrode branch portions 171B arranged on the side surfaces of the first inner bank 410, and the second electrode branch portions 173B arranged on the side surfaces of the second inner bank 420. The first electrode branch portion 171B arranged on the upper surface of the first inner bank 410 and the second electrode branch portion 173B arranged on the upper surface of the second inner bank 420 may be exposed without being covered with the second insulating layer 181. The second insulating layer 181 may be arranged on the outer bank 430. The second insulating layer 181 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 181 may be a single layer or a multi-layer including the above-described inorganic insulating material.

The LED 175 may be arranged on the second insulating layer 181 between the first inner bank 410 and the second inner bank 420. FIG. 6 illustrates that the single LED 175 is arranged between the first inner bank 410 and the second inner bank 420, but embodiments are not limited thereto. 5 to 15 LEDs 175, for example, 8 to 12 LEDs 175, may be arranged between the first inner bank 410 and the second inner bank 420.

An LED layer EML according to an embodiment may be formed by applying a voltage between the first electrode 171 and the second electrode 173, which are formed on the substrate SUB, to form an electric field and dropping an ink composition containing the LEDs 175 on the first electrode 171 and the second electrode 173 such that the LEDs 175 are aligned on the first electrode 171 and the second electrode 173 by the electric field.

A third insulating layer 182 may be arranged on the LED 175. The third insulating layer 182 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 182 may be a single layer or a multi-layer including the above-described inorganic insulating material.

A first contact electrode 174a may be arranged on the first electrode branch portion 171B exposed without being covered with the second insulating layer 181 and may be in contact (e.g., physical contact) with one end of the LED 175. The first contact electrode 174a may also be arranged on the third insulating layer 182.

A fourth insulating layer 183 may be arranged on the first contact electrode 174a. The fourth insulating layer 183 may be arranged to cover the first contact electrode 174a so as to electrically separate the first contact electrode 174a from the second contact electrode 174b. The fourth insulating layer 183 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The fourth insulating layer 183 may be a single layer or a multi-layer including the above-described inorganic insulating material.

The second contact electrode 174b may be arranged on the second electrode branch portion 173B exposed without being covered with the second insulating layer 181 and may be in contact (e.g., physical contact) with the other end of the LED 175. The second contact electrode 174b may also be arranged on the third insulating layer 182 and the fourth insulating layer 183.

An encapsulation layer TFE may be arranged on the LED layer EML. The encapsulation layer TFE may include at least one inorganic encapsulation layer and at least one organic encapsulation layer. In an embodiment, the encapsulation layer TFE may include a first inorganic encapsulation layer, a second inorganic encapsulation layer, and an organic encapsulation layer arranged between the first inorganic encapsulation layer and the second inorganic encapsulation layer. The first inorganic encapsulation layer and the second inorganic encapsulation layer may each include one or more inorganic insulating materials selected from aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include an acryl-based resin, an epoxy-based resin, polyimide, polyethylene, and/or the like. In another embodiment, the encapsulation layer TFE may be provided as an encapsulation substrate.

Figure 7:
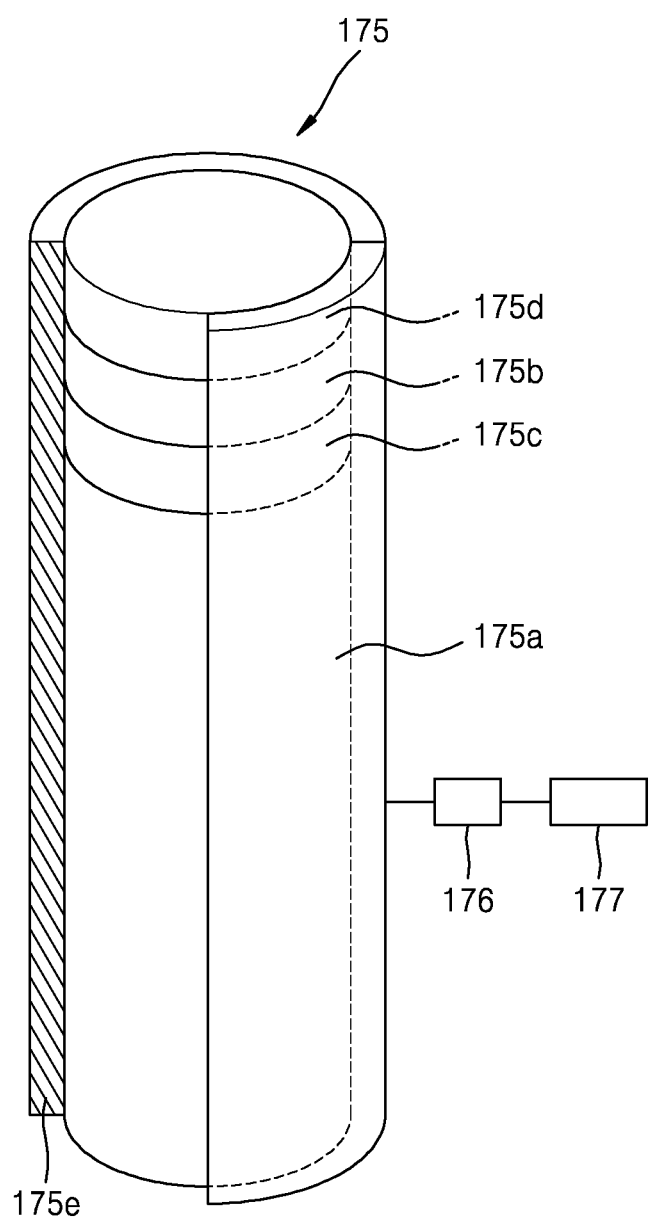
FIG. 7 is a schematic cross-sectional view of an LED according to an embodiment.

FIG. 7 is a schematic cross-sectional view of the LED 175 according to an embodiment.

Referring to FIG. 7, the LED 175 according to the embodiment may include a first ligand 176 bonded to the surface of the LED 175 and a second ligand 177 bonded to the first ligand 176. For example, the LED 175 may include the first ligand 176 bonded to the insulating layer 175e of the LED 175 and the second ligand 177 bonded to the first ligand 176. FIG. 7 illustrates that the single first ligand 176 is bonded to the LED 175 and the single second ligand 177 is bonded to the first ligand 176, but embodiments are not limited thereto. A plurality of first ligands 176 may be bonded to the surface of the LED 175 along the periphery of the LED 175, and a plurality of second ligands 177 may be respectively bonded to the first ligands 176 that are bonded to the surface of the LED 175.

The first ligand 176 may be selected from compounds represented by Formula 1:

$$A_1\text{-}R_1\text{-}A_2 \qquad \text{Formula 1}$$

In Formula 1, $A_1$ is selected from an alkylsiloxane group, an alkanephosphonic acid group, a catechol group, a carboxylic acid group, a thiol group, and an amine group, $A_2$ is selected from a halogen group, a vinyl group, an azide group, an oxirane group, an amine group, a hydroxyl group, an alcohol group, an ether group, an ester group, and a ketone group, and $R_1$ is selected from an alkyl group, a cyclohexyl group, a phenyl group, a methoxy group, an ether group, and an amide group, where each of the alkyl group, the cyclohexyl group, the phenyl group, the methoxy group, the ether group, and the amide group have 1 to 12 carbon atoms.

In an embodiment, the first ligand 176 may be derived from a compound represented by one selected from Formulae 2-1 to 2-36:

Formula 2-1

Formula 2-2

Formula 2-3

Formula 2-4

Formula 2-5

Formula 2-6

Formula 2-7

Formula 2-8

Formula 2-9

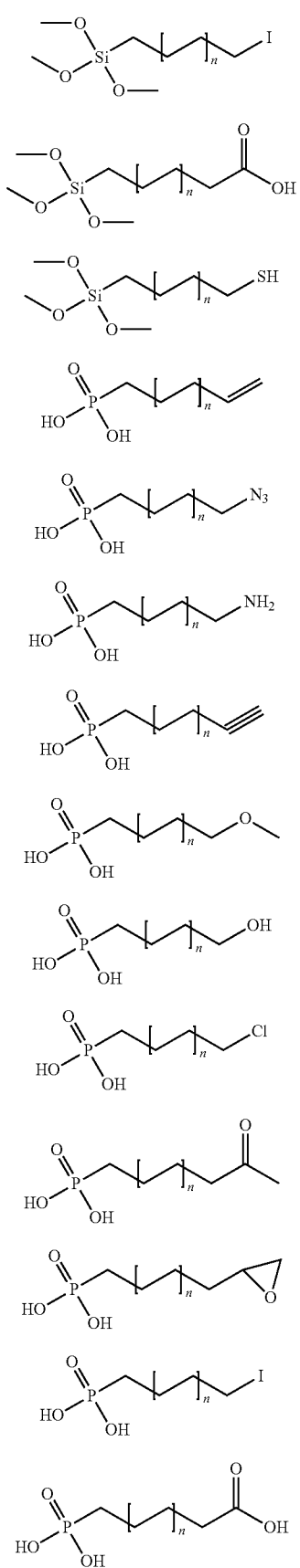
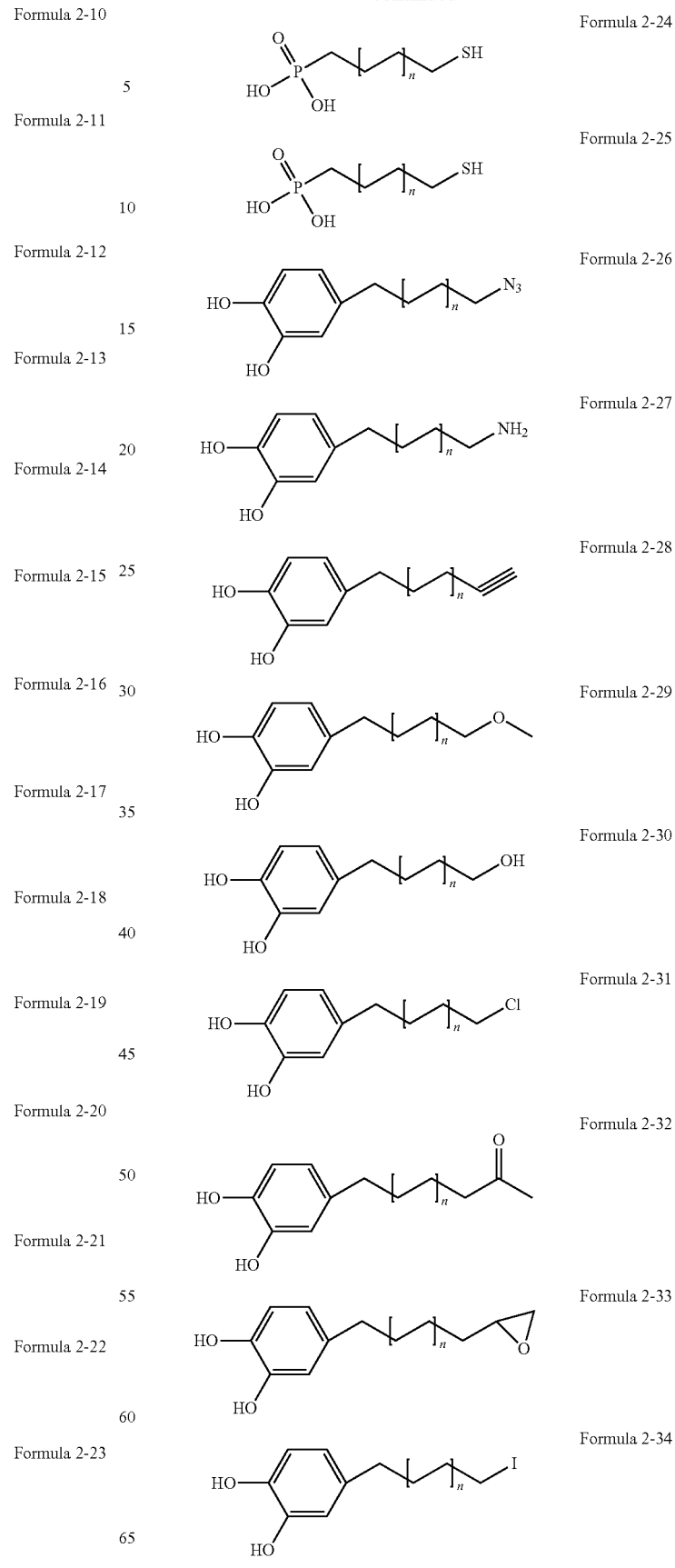

-continued

Formula 2-35

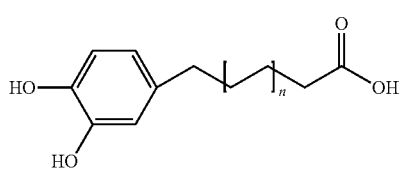

Formula 2-36

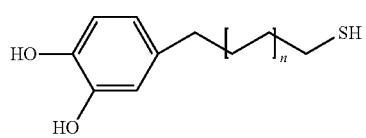

n is an integer from 1 to 12.

In an embodiment, the first ligand 176 may have a weight average molecular weight in a range of about 150 to about 500 daltons. For example, the first ligand 176 may be an organic monomer.

The second ligand 177 may be derived from a compound represented by one selected from Formulae 3-1 to 3-3:

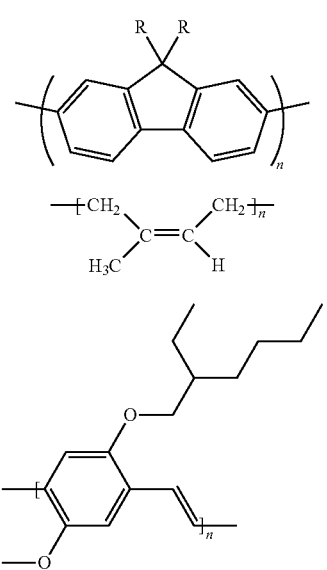

Formula 3-1

Formula 3-2

Formula 3-3

$R_2$ is selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group, $R_3$ is selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group, and n is an integer from 2 to 100.

In an embodiment, the second ligand 177 may be a polymer compound and may have a weight average molecular weight in a range of about 1,000 to about 90,000 daltons. For example, the second ligand 177 may be a compound that is different from the first ligand 176.

In an embodiment, the first ligand 176 and the second ligand 177 may be bonded to each other by a condensation reaction or a polymerization reaction. For example, because the first ligand 176 and the second ligand 177 are bonded to each other, a length of a chain may be increased.

Hereinafter, the LED according to the embodiment will be described in more detail with reference to Examples.

EXAMPLES

An LED (Example 1) in which a first ligand was bonded to a surface and a second ligand was bonded to the first ligand and LEDs (Comparative Examples 1 to 7) in which no ligand was bonded were manufactured, and the degree of alignment according to characteristics (dielectric constant and viscosity) of a solvent included in an ink composition was measured. Results thereof are shown in Table 1 below.

TABLE 1

| Classification | Characteristics of solvent | | Degree of alignment |
|---|---|---|---|
| | ε (dielectric constant) | η(cP) (viscosity) | |
| Example 1 | 9.5 | 8 | 85% |
| Comparative Example 1 | 10.0 | 4.8 | 70% |
| Comparative Example 2 | 11.6 | 20.7 | 35% |
| Comparative Example 3 | 3.8 | 5.4 | 0 (no dispersion) ✗ Dispersed only in polar solvent |
| Comparative Example 4 | 2.4 | 10.8 | 0 (no dispersion) ✗ Dispersed only in polar solvent |
| Comparative Example 5 | 18.2 | 1.9 | 50% or less |
| Comparative Example 6 | 20 | 8 | 40% |
| Comparative Example 7 | 37 | 17 | 5% |

Referring to Table 1, it can be seen that the LED (Example 1) in which the first ligand was bonded to the surface of the LED and the second ligand was bonded to the first ligand has an improved degree of alignment, as compared with the LEDs (Comparative Examples 1 to 7) in which no ligand was bonded. The LED (Example 1) in which the first ligand was bonded to the surface of the LED and the second ligand was bonded to the first ligand may have a high degree of alignment even when a solvent having a low viscosity is used, may adjust the degree of polarity of the solvent according to the structures of the first ligand and the second ligand, and may have a high degree of alignment even when a solvent having a low dielectric constant is used.

When an ink composition including LEDs was dropped on a first electrode and a second electrode such that the LEDs were aligned between the first electrode and the second electrode by an electric field, the LEDs did not disperse in the ink composition and precipitated down because the dispersibility of the LEDs to the ink composition was low, thereby reducing the degree of alignment in which the LEDs were aligned between the first electrode and the second electrode.

According to one or more embodiments, an LED in which the first ligand 176 is bonded to the surface of the LED 175 and the second ligand 177 is bonded to the first ligand 176, thereby improving the dispersibility of the LED to the ink composition and improving the ratio at which LEDs are aligned between a pair of electrodes, may be provided. In addition, according to one or more embodiments, a display apparatus including the LED may be provided.

For example, the surface of the LED is primarily modified by using a first ligand (an organic monomer) having a small steric effect, and a second ligand (an organic polymer) is bonded to the first ligand through a condensation reaction, thereby increasing a chain length of a ligand. Therefore, the dispersibility for the ink composition may be improved and at the ratio at which LEDs are aligned between the pair of electrodes may be improved.

As described above, according to one or more embodiments, it is possible to implement the display apparatus, in which the first ligand is bonded to the surface of the independently manufactured nano- or micro-scale LED and the second ligand is bonded to the first ligand, thereby improving the dispersibility of the LED to the ink composition and improving the ratio at which LEDs are aligned between a pair of electrodes. The scope of the disclosure, however, is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the appended claims, and equivalents thereof.

What is claimed is:

1. A light-emitting device (LED) comprising:
   a first semiconductor layer;
   a second semiconductor layer facing the first semiconductor layer;
   an insulating layer arranged to at least partially surround outer surfaces of the first semiconductor layer and the second semiconductor layer; and
   a first ligand bonded to a surface of the insulating layer and a second ligand bonded to the first ligand,
   wherein the first ligand consists of an organic monomer.

2. The LED of claim 1, wherein the first ligand is derived from a compound represented by Formula 1:

$$A_1\text{-}R_1\text{-}A_2 \qquad \text{Formula 1}$$

wherein, in Formula 1,
   $A_1$ is selected from an alkylsiloxane group, an alkanephosphonic acid group, a catechol group, a carboxylic acid group, a thiol group, and an amine group,
   $A_2$ is selected from a halogen group, a vinyl group, an azide group, an oxirane group, an amine group, a hydroxyl group, an alcohol group, an ether group, an ester group, and a ketone group, and
   $R_1$ is selected from an alkyl group, a cyclohexyl group, a phenyl group, a methoxy group, an ether group, and an amide group, each of which have 1 to 12 carbon atoms.

3. The LED of claim 1, wherein the first ligand is derived from a compound represented by one selected from Formulae 2-1 to 2-36:

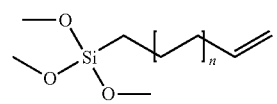

Formula 2-1

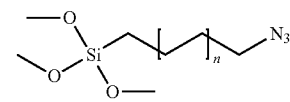

Formula 2-2

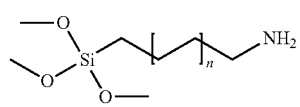

Formula 2-3

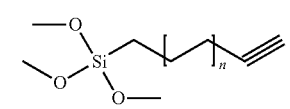

Formula 2-4

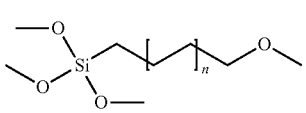

Formula 2-5

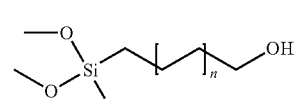

Formula 2-6

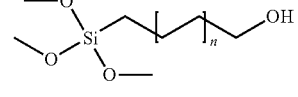

Formula 2-7

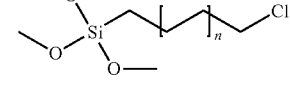

Formula 2-8

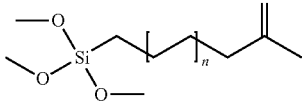

Formula 2-9

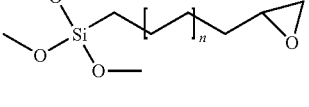

Formula 2-10

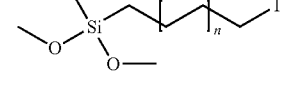

Formula 2-11

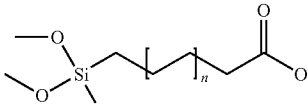

Formula 2-12

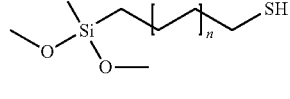

Formula 2-13

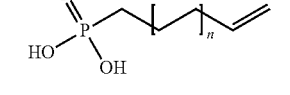

Formula 2-14

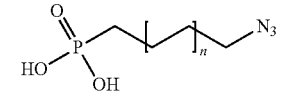

Formula 2-15

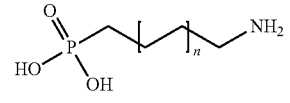

Formula 2-16
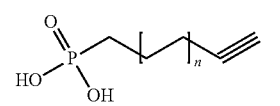

Formula 2-17
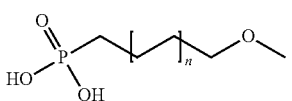

Formula 2-18
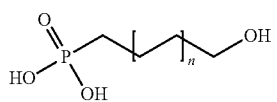

Formula 2-19
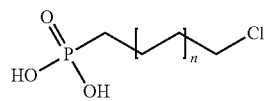

Formula 2-20
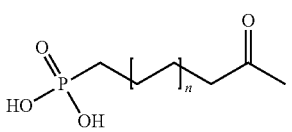

Formula 2-21
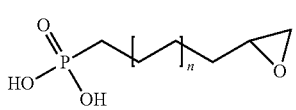

Formula 2-22
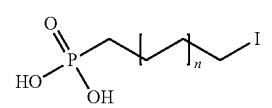

Formula 2-23
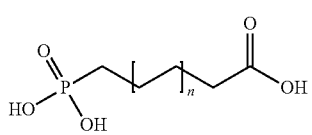

Formula 2-24
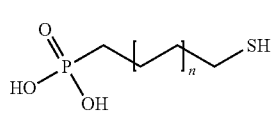

Formula 2-25
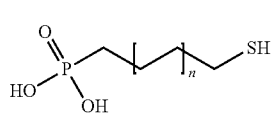

Formula 2-26
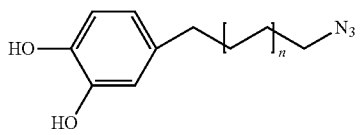

Formula 2-27
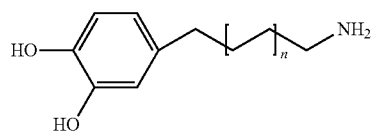

Formula 2-28
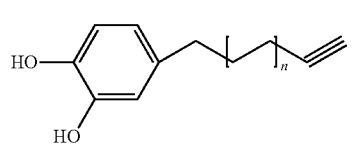

Formula 2-29
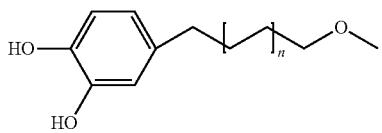

Formula 2-30
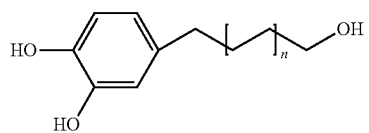

Formula 2-31
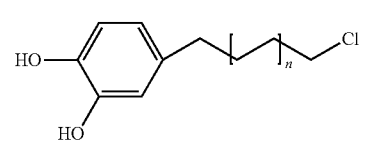

Formula 2-32
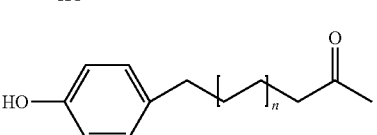

Formula 2-33
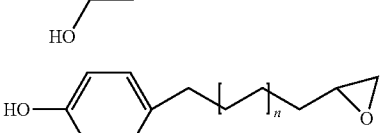

Formula 2-34
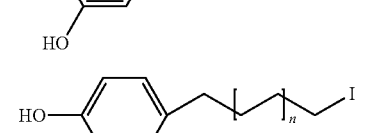

Formula 2-35
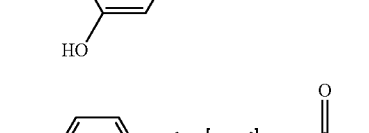

Formula 2-36
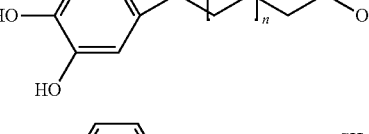

wherein n is an integer from 1 to 12.

4. The LED of claim 1, wherein the first ligand has a weight average molecular weight in a range of about 150 to about 500 daltons.

5. The LED of claim 1, wherein the second ligand is derived from a compound represented by one selected from Formulae 3-1 to 3-3:

Formula 3-1
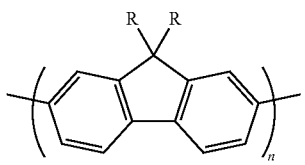

-continued

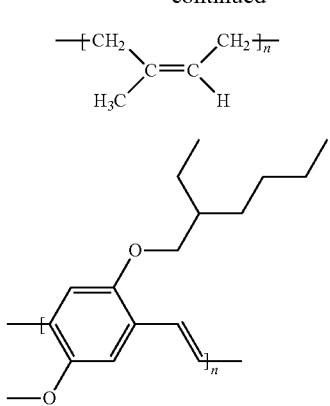

Formula 3-2

Formula 3-3 wherein $R_2$ is selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group, $R_3$ is selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group, and n is an integer from 2 to 300.

6. The LED of claim 1, wherein the second ligand comprises a polymer compound and has a weight average molecular weight in a range of about 1,000 to about 90,000 daltons.

7. The LED of claim 1, wherein,
the first ligand and the second ligand are bonded to each other by a condensation reaction or a polymerization reaction.

8. The LED of claim 1, wherein the first ligand and the second ligand are different from each other.

9. The LED of claim 1, further comprising:
an active layer arranged between the first semiconductor layer and the second semiconductor layer; and
an electrode layer arranged on the second semiconductor layer.

10. The LED of claim 9, wherein the insulating layer is arranged to at least partially surround outer surfaces of the first semiconductor layer, the second semiconductor layer, the active layer, and the electrode layer.

11. The LED of claim 10, wherein one end of the first semiconductor layer and one end of the electrode layer are exposed without being covered with the insulating layer.

12. The LED of claim 1, wherein the insulating layer comprises at least one material selected from silicon oxide ($SiO_x$), silicon nitride ($SiN_x$), silicon oxynitride ($SiO_xN_y$), aluminum nitride (AlN), and aluminum oxide ($Al_2O_3$).

13. The LED of claim 1, wherein a diameter of the LED is in a range of about 0.1 μm to about 0.9 μm.

14. The LED of claim 13, wherein a length of the LED is in a range of about 0.5 μm to about 9 μm.

15. The LED of claim 14, wherein an aspect ratio of the LED is in a range of about 5 to about 10.

16. A display apparatus comprising:
a substrate comprising a display area and a non-display area arranged around the display area;
a first electrode and a second electrode spaced apart from each other in the display area; and
a light-emitting device (LED) arranged between the first electrode and the second electrode,
wherein the LED comprises a first semiconductor layer, a second semiconductor layer, an active layer, an electrode layer, and an insulating layer,
wherein a first ligand is bonded to a surface of the LED, and a second ligand is bonded to the first ligand, and
wherein the first ligand consists of an organic monomer.

17. The display apparatus of claim 16, wherein the first ligand is bonded to the insulating layer of the LED.

18. The display apparatus of claim 16, wherein the first ligand has a weight average molecular weight in a range of about 150 to about 500 daltons.

19. The display apparatus of claim 16, wherein the second ligand comprises a polymer compound and has a weight average molecular weight in a range of about 1,000 to about 90,000 daltons.

20. The display apparatus of claim 16, further comprising:
a first contact electrode coupled to the first electrode; and
a second contact electrode coupled to the second electrode,
wherein the LED is arranged between the first contact electrode and the second contact electrode.

* * * * *